(12) United States Patent
Shim et al.

(10) Patent No.: US 9,123,638 B2
(45) Date of Patent: Sep. 1, 2015

(54) MULTI-HETEROJUNCTION NANOPARTICLES, METHODS OF MANUFACTURE THEREOF AND ARTICLES COMPRISING THE SAME

(71) Applicants: Moonsub Shim, Savoy, IL (US); Nuri Oh, Champaign, IL (US); You Zhai, Urbana, IL (US); Sooji Nam, Urbana, IL (US); Peter Trefonas, Medway, MA (US); Kishori Deshpande, Lake Jackson, TX (US); Jake Joo, Somerville, MA (US)

(72) Inventors: Moonsub Shim, Savoy, IL (US); Nuri Oh, Champaign, IL (US); You Zhai, Urbana, IL (US); Sooji Nam, Urbana, IL (US); Peter Trefonas, Medway, MA (US); Kishori Deshpande, Lake Jackson, TX (US); Jake Joo, Somerville, MA (US)

(73) Assignees: Rohm and Haas Electronic Materials, LLC, Marlborough, MA (US); The University of Illinois, The Office of Technology Management, Urbana, IL (US); Dow Global Technologies LLC, Midland, MI (US)

( * ) Notice: Subject to any disclaimer, the term of this patent is extended or adjusted under 35 U.S.C. 154(b) by 0 days.

(21) Appl. No.: 13/834,381

(22) Filed: Mar. 15, 2013

(65) Prior Publication Data
US 2014/0264259 A1    Sep. 18, 2014

(51) Int. Cl.
*H01L 29/06* (2006.01)
*H01L 29/22* (2006.01)
*B82Y 10/00* (2011.01)
(Continued)

(52) U.S. Cl.
CPC ............... *H01L 29/22* (2013.01); *B82Y 10/00* (2013.01); *B82Y 30/00* (2013.01); *B82Y 40/00* (2013.01); *H01L 29/068* (2013.01); *H01L 29/0669* (2013.01); *H01L 29/127* (2013.01); *H01L 31/0296* (2013.01); *H01L 31/035218* (2013.01); *H01L 31/035227* (2013.01); *H01L 33/06* (2013.01); *H01L 51/50* (2013.01);
(Continued)

(58) Field of Classification Search
CPC .............................. H01L 29/22; H01L 33/06
USPC ......................................................... 257/13
See application file for complete search history.

(56) References Cited

U.S. PATENT DOCUMENTS 6,788,453 B2    9/2004  Banin et al.
7,135,057 B2 *  11/2006 Kornilovich ...................... 95/90
(Continued)

OTHER PUBLICATIONS

Hwang et al., Enhancing P-type Conductivity in Mg-doped GaN Using Oxygen and Nitrogen Plasma Activation; Japanese Journal of Applied Physics vol. 44, No. 4A, 2005, pp. 1726-1729.*
(Continued)

*Primary Examiner* — Jarrett Stark
*Assistant Examiner* — Mohammad M Hoque
(74) *Attorney, Agent, or Firm* — Mintz Levin Cohn Ferris Glovsky and Popeo, P.C.; Peter F. Corless

(57) ABSTRACT

Disclosed herein is a semiconducting nanoparticle comprising a one-dimensional semiconducting nanoparticle having a first end and a second end; where the second end is opposed to the first end; a first node that comprises a first semiconductor; where the first node contacts a radial surface of the one-dimensional semiconducting nanoparticle producing a first heterojunction at the point of contact; and a second node that comprises a second semiconductor; where the second node contacts the radial surface of the one-dimensional semiconducting nanoparticle producing a second heterojunction at the point of contact; where the first heterojunction is compositionally different from the second heterojunction.

3 Claims, 8 Drawing Sheets

(51) Int. Cl.
| | |
|---|---|
| B82Y 30/00 | (2011.01) |
| B82Y 40/00 | (2011.01) |
| H01L 31/0296 | (2006.01) |
| H01L 31/0352 | (2006.01) |
| H01L 29/12 | (2006.01) |
| H01L 33/06 | (2010.01) |
| H01L 51/50 | (2006.01) |
| B82Y 20/00 | (2011.01) |

(52) U.S. Cl.
CPC .............. *B82Y 20/00* (2013.01); *Y10S 977/774* (2013.01); *Y10S 977/95* (2013.01)

(56) References Cited

U.S. PATENT DOCUMENTS

| | | | |
|---|---|---|---|
| 7,303,628 B2 | 12/2007 | Alivisatos et al. | |
| 7,390,568 B2 | 6/2008 | Kim et al. | |
| 7,534,488 B2 | 5/2009 | Alivisatos et al. | |
| 7,570,355 B2 * | 8/2009 | Kamins et al. | 356/301 |
| 7,872,318 B2 * | 1/2011 | Stewart et al. | 257/414 |
| 7,964,278 B2 | 6/2011 | Banin et al. | |
| 8,087,151 B2 * | 1/2012 | Park et al. | 29/592.1 |
| 8,377,729 B2 * | 2/2013 | Kahen et al. | 438/47 |
| 8,829,460 B2 * | 9/2014 | Nikolic et al. | 250/390.01 |
| 2003/0214699 A1 * | 11/2003 | Banin et al. | 359/333 |
| 2004/0026684 A1 * | 2/2004 | Empedocles | 257/14 |
| 2005/0266662 A1 * | 12/2005 | Yi | 438/479 |
| 2007/0152236 A1 * | 7/2007 | Halpert et al. | 257/183 |
| 2010/0012168 A1 * | 1/2010 | Mihaila et al. | 136/244 |
| 2010/0279495 A1 * | 11/2010 | Ueno et al. | 438/508 |
| 2011/0127490 A1 * | 6/2011 | Mi | 257/13 |
| 2011/0195010 A1 | 8/2011 | Kim et al. | |
| 2013/0153012 A1 * | 6/2013 | Harris et al. | 136/255 |
| 2013/0175155 A1 * | 7/2013 | Lee et al. | 202/185.1 |

OTHER PUBLICATIONS

He, Z., et al. "Capillary microchannel-based microreactors with highly durable ZnO/TiO2 nanorod arrays for rapid, high efficiency and continuous-flow photocatalysis" Applied Catalysis B: Environmental 93 (2010) 376-382.

Jin, H. D. et al. "Continuous synthesis of SnTe nanorods" J. Mater. Chem., 2011, 21, 12218-12220.

Yang, Q., et al. "Enhancing Light Emission of ZnO Microwire-Based Diodes by Piezo-Phototronic Effect" Nano Lett. 2011, 11, 4012-4017.

* cited by examiner

MULTI-HETEROJUNCTION NANOPARTICLES, METHODS OF MANUFACTURE THEREOF AND ARTICLES COMPRISING THE SAME

BACKGROUND

This disclosure relates to double heterojunction nanoparticles, methods of manufacture thereof and to articles comprising the same.

One of the advantages of semiconductor nanocrystals is their potential for improving the efficiencies of optoelectronic devices. Spherical nanocrystal heterostructures, sometimes referred to as core-shell quantum dots, have been widely used for quantum dot light emitting diodes (LEDs). In these core-shell heterostructures which mainly consist of type I (straddling) band offset, the heterojunction serves merely as a passivation layer to improve photoluminescence efficiency. Owing to their unique optical and electronic properties, semiconductor nanocrystals have attracted much attention in various opto-electronic applications including photovoltaics (PVs), LEDs, solid state lighting, and displays. These tiny crystals have one or more dimensions that are a few nanometers in length, which allows tuning of their electronic band gap. The change in the band gap and the electronic energy levels allows one to control the observed optical and electrical properties of the semiconductor.

In addition, when two or more semiconductor materials are brought together, one can expect new and improved optical and electronic properties depending on their relative band offsets and band alignment. The heterojunction that is formed at the interface of dissimilar semiconductors can help to direct electrons and holes as well as being an active component for a variety of devices including PVs, LEDs and transistors. By choosing different materials for the core and the shell, the band edge positions may be varied. However, the effective band gap and the band offsets for some combinations of materials may be large and may hinder carrier injection processes. It is therefore desirable to produce semiconducting nanoparticles that have multiple heterojunctions. Particles having multiple heterojunctions allow the band gap and band offsets at different interfaces to be tuned by virtue of having more than two semiconducting materials selectively contacting one another.

Benefits of multiple heterojunctions include facilitating carrier injection and/or blocking while providing improved photoluminescence yields by surface passivation of the central "core"—that is, by creating multiple heterojunctions with a combination of type I and type II band offsets. This facilitates the achievement of a good barrier for one type of carrier while facilitating injection of the other carrier type in addition to the surface passivation benefits equivalent to type I core/shells.

SUMMARY

Disclosed herein is a semiconducting nanoparticle comprising a one-dimensional semiconducting nanoparticle having a first end and a second end; where the second end is opposed to the first end; a first node that comprises a first semiconductor; where the first node contacts a radial surface of the one-dimensional semiconducting nanoparticle producing a first heterojunction at the point of contact; and a second node that comprises a second semiconductor; where the second node contacts the radial surface of the one-dimensional semiconducting nanoparticle producing a second heterojunction at the point of contact; where the first heterojunction is compositionally different from the second heterojunction.

Disclosed herein too is a method comprising reacting a first precursor to a semiconductor with a second precursor to a semiconductor to form a one-dimensional semiconducting nanoparticle; where the first one-dimensional semiconducting nanoparticle has a first end and a second end that is opposed to the first end; reacting a third precursor to a semiconductor with the one dimensional nanoparticle to form the first node that contacts the one-dimensional nanoparticle at a radial surface to form a first heterojunction; and reacting the one-dimensional nanoparticle having the first node disposed thereon with a fourth precursor to a semiconductor to form a second node that is disposed at the radial surface of the one-dimensional semiconducting nanoparticle and forms a second heterojunction; where the second heterojunction is compositionally different from the first heterojunction.

Disclosed herein too is an article comprising a first electrode; a second electrode; and a layer comprising a semiconducting nanoparticle disposed between the first electrode and the second electrode; where the semiconducting nanoparticle comprises a one-dimensional semiconducting nanoparticle having a first end and a second end; where the second end is opposed to the first end; and a first node that comprises a first semiconductor; where the first node contacts a radial surface of the one-dimensional semiconducting nanoparticle producing a first heterojunction at the point of contact; and a second node that comprises a second semiconductor; where the second node contacts the radial surface of the one-dimensional semiconducting nanoparticle producing a second heterojunction at the point of contact; where the first heterojunction is compositionally different from the second heterojunction.

BRIEF DESCRIPTION OF THE FIGURES

In FIG. 2, the nanoparticle comprises a cadmium sulfide (CdS) one-dimensional nanoparticle, with the first endcap being cadmium selenide (CdSe) and the second endcap being zinc selenide (ZnSe);

DETAILED DESCRIPTION

Figure 1A:
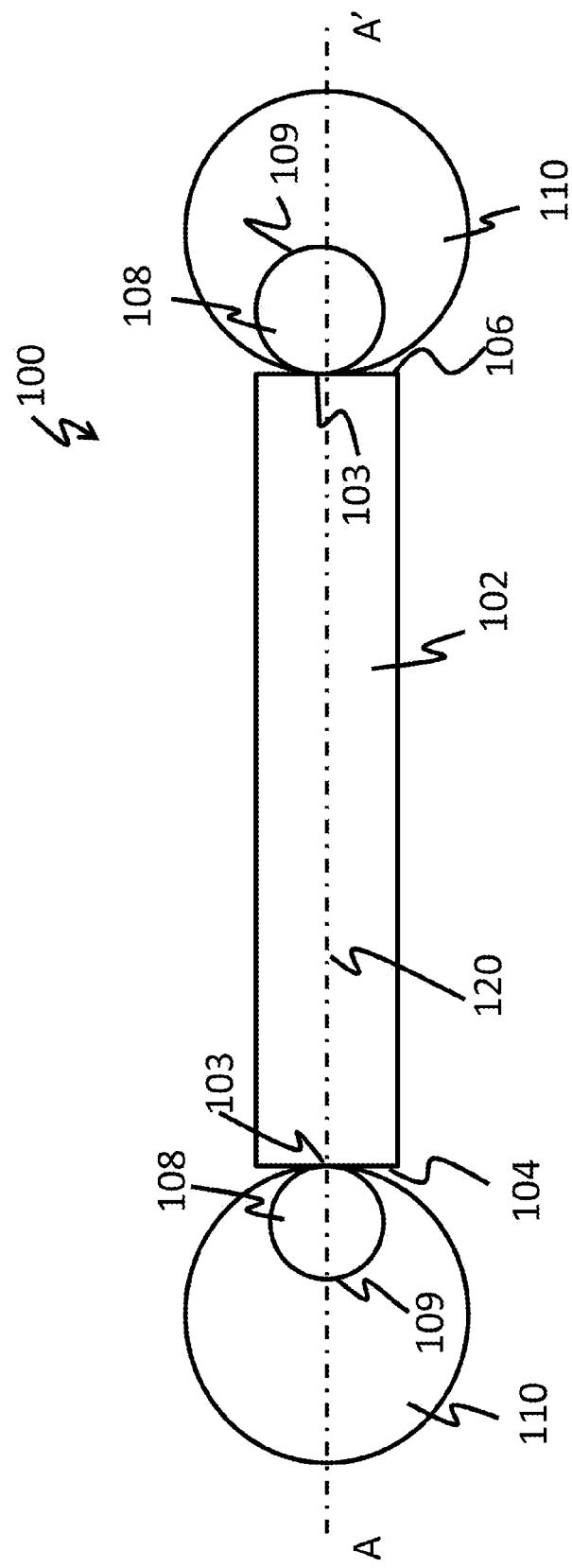
FIG. 1(A) is a depiction of the passivated nanocrystalline semiconductor nanoparticles disclosed herein.

Disclosed herein are passivated nanocrystalline semiconductor nanoparticles (hereinafter nanoparticles) that comprise a plurality of heterojunctions and which facilitate charge carrier injection processes that enhance light emission when used in a device. The nanocrystalline semiconductor nanoparticles are passivated only at some positions while being unpassivated at other positions. These multi-heterojunction passivated nanoparticles can serve as active elements in easy-to-fabricate, high-performance optoelectronic devices including light emitting diodes (LEDs). The nanoparticles comprise a one-dimensional nanoparticle that has disposed at each end a single endcap or a plurality of endcaps that contact the one-dimensional nanoparticle. The endcaps also contact each other. The endcaps serve to passivate the one-dimensional nanoparticles. The nanoparticles can be symmetrical or asymmetrical about at least one axis. The nanoparticles can be asymmetrical in composition, in geometric structure and electronic structure, or in both composition and structure.

In one embodiment, the nanoparticle comprises a one-dimensional nanoparticle that comprises an endcap at each opposing end along its longitudinal axis. Each endcap has a different composition, thus providing the nanoparticle with multiple heterojunctions. In another embodiment, the nanoparticle comprises a one-dimensional nanoparticle that comprises an endcap at each opposing end along its longitudinal axis and further comprises nodes disposed on a radial surface of the one-dimensional nanoparticle or on the endcaps. The radial surface is also termed the lateral surface of the rods. The endcaps can have similar or different compositions from each other and/or the nodes can have similar or different compositions from each other so long as one of the endcaps has a different composition from either the other endcap or from at least one of the nodes.

In one embodiment, the plurality of endcaps comprises a first endcap and a second endcap that partially or completely encircles the first endcap. The endcaps are three dimensional nanoparticles, at least one of which directly contacts the one-dimensional nanoparticle. Each endcap may or may not contact the one-dimensional nanoparticle. The first endcap and the second endcap can have different compositions from each other. The nodes are also three dimensional nanoparticles that can be smaller or larger in size than the endcaps.

The term "heterojunction" implies structures that have one semiconductor material grown into the crystal lattice of another semiconductor material. The term one-dimensional nanoparticle includes objects where the mass of the nanoparticle varies with a characteristic dimension (e.g., the length) of the nanoparticle to the first power. This is shown in the formula (1) below:

$$M \alpha L^d \quad (1)$$

where M is the mass of the particle, and L is the length of the particle and d is an exponent that determines the dimensionality of the particle. For example, when d=1, the mass of the particle is directly proportional to the length of the particle and the particle is termed a one-dimensional nanoparticle. When d=2, the particles is a two-dimensional object such as a plate while d=3 defines a three-dimensional object such as a cylinder or a sphere. The one-dimensional nanoparticles (particles where d=1) include nanorods, nanotubes, nanowires, nanowhiskers, nanoribbons, or the like. In one embodiment, the one-dimensional nanoparticle may be curved or wavy (as in serpentine), i.e., have values of d that lie between 1 and 1.5.

The one-dimensional nanoparticles have cross-sectional areas whose characteristic thickness dimension (e.g., the diameter for a circular cross-sectional area or a diagonal for a square or rectangular cross-sectional area) are 1 nm to 1000 nanometers (nm), preferably 2 nm to 50 nm, and more preferably 5 nm to 20 nm (such as about 6, 7, 8, 9, 10, 11, 12, 13, 14, 15, 16, 17, 18, 19, or 20 nm) in diameter. Nanorods are rigid rods that have circular cross-sectional areas whose characteristic dimensions lie within the aforementioned ranges. Nanowires or nanowhiskers are curvaceous and have different serpentine or vermicular shapes. Nanoribbons have cross-sectional areas that are bounded by four or five linear sides. Examples of such cross-sectional areas are square, rectangular, parallelopipeds, rhombohedrals, and the like. Nanotubes have a substantially concentric hole that traverses the entire length of the nanorod, thereby causing it to be tube-like. The aspect ratios of these one-dimensional nanoparticles are greater than or equal to 2, preferably greater than or equal to 5, and more preferably greater than or equal to 10.

The one-dimensional nanoparticles comprise semiconductors that include those of the group II-VI (ZnS, ZnSe, ZnTe, CdS, CdSe, CdTe, HgS, HgSe, HgTe, and the like) and III-V (GaN, GaP, GaAs, GaSb, InN, InP, InAs, InSb, AlAs, AlP, AlSb, and the like) and IV (Ge, Si, Pb and the like) materials, and an alloy thereof, or a mixture thereof.

The one-dimensional nanoparticle, the first endcap and the second endcap each comprise semiconductors. The interface between the nanorods and the first endcap provides a first heterojunction, while the interface between the first endcap and the second endcap provides a second heterojunction. In this manner the nanoparticles may comprise a plurality of heterojunctions.

With reference now to the FIG. 1A, the nanoparticle 100 comprise a one-dimensional nanoparticle 102 that has a first end 104 and the second end 106. The first endcap 108 is disposed at the first end 104 and the second end 106 of the one-dimensional nanoparticle and directly contacts the one-dimensional nanoparticle 102. The interface between the first endcap 108 and the first end 104 of the one-dimensional nanoparticle forms the first heterojunction 103. In one embodiment, the first endcap 108 contacts the ends of the one-dimensional nanoparticle 102 and does not contact the longitudinal portion of the one-dimensional nanoparticle 102. It is preferable that the first endcap 108 does not surround the entire one-dimensional nanoparticle 102.

The second endcap 110 contacts the first endcap 108 and surrounds the first endcap 108 at one or both ends of the one-dimensional nanoparticle 102. The second endcap 110 may partially or fully surround the first endcap 108. It is preferable that the second endcap 110 does not surround the entire one-dimensional nanoparticle 102.

The interface between the second endcap 110 and the first endcap 108 forms the second heterojunction 109. The nanoparticle 100 in the FIG. 1 is therefore a double heterojunction nanoparticle. In the event that more endcaps are disposed on the second endcap 110, the nanoparticle 100 would have more than 2 heterojunctions. In an exemplary embodiment, the nanoparticle 100 may have 3 or more heterojunctions, preferably 4 or more heterojunctions, or preferably 5 or more heterojunctions.

In one embodiment, the heterojunction at which the one dimensional nanoparticle contacts the first endcap has a type I or quasi-type II band alignment. In another embodiment, the point at which the second endcap contacts the first endcap has a type I or quasi-type II band alignment.

The one-dimensional nanoparticle can comprise a nanorod, a nanowire, a nanotube, a nanowhisker, or the like. In an exemplary embodiment the nanoparticle is a nanorod. It is termed a "one-dimensional" nanoparticle because it has a length that is larger than its diameter and because its mass varies with its length to the first power as shown in the Equation (1) above.

The one-dimensional nanoparticle can have a length of 10 to 100 nanometers, preferably 12 to 50 nanometers and more preferably 14 to 30 nanometers. The one-dimensional nanoparticle can have a diameter of 2 to 10 nanometers, preferably 3 to 7 nanometers. The one-dimensional nanoparticles have an aspect ratio that is greater than or equal to about 3, preferably greater than or equal to about 7, and more preferably greater than or equal to about 12. The one-dimensional nanoparticle is a nanocrystal and comprises a binary, ternary, or quarternary semiconductor. The semiconductor can comprise 5 or more elements if desired.

The semiconductor used in the one-dimensional nanoparticle is a Group II-VI compound, a Group II-V compound, a Group III-VI compound, a Group III-V compound, a Group IV-VI compound, a Group I-III-VI compound, a Group II-IV-VI compound, or a Group II-IV-V compound. More preferably, the one-dimensional nanoparticle may be selected from the group consisting of Si, Ge, Pb, SiGe, ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, PbTe, or the like, or a combination comprising at least one of the foregoing semiconductors. In an exemplary embodiment, the one-dimensional nanoparticle comprises CdS.

With reference now once again to the FIG. 1(A), the one-dimensional nanoparticle 102 comprises a first end 104 and a second end 106 that are opposed to each other. The first endcap 108 contacts the first end 104 and the second end 106 of the one-dimensional nanoparticle. In one embodiment, the first endcap 108 may completely cover the first end 104 and the second end 106 of the one-dimensional nanoparticle 102. In another embodiment, the first endcap 108 may contact the first end 104 and the second end 106 tangentially. The first endcap 108 is generally spherical or ellipsoidal in shape and has a cross-sectional area that is circular or elliptical. In one embodiment, the first and second endcap can be cylindrical, but have a shorter aspect ratio than the one dimensional nanoparticle.

The diameter of the first endcap 108 is about 0.5 to about 1.5 times, preferably about 0.7 to about 1.2 times the diameter of the one-dimensional nanoparticle. In one embodiment, the diameter of the first endcap is 1 to 15 nanometers, preferably 2 to 12 nanometers.

In one embodiment, as noted above, the nanoparticle can be compositionally asymmetric while being structurally symmetrical. In other words, the first endcap 108 and/or the second endcap 110 that contacts the opposing ends of the one-dimensional nanoparticle 102 can have different compositions at the opposing ends, while being dimensionally and geometrically identical. This is detailed further in the FIG. 1(B) below.

In another embodiment (not shown here), the first endcap 108 and/or the second endcap 110 can be compositionally identical while being of different sizes or different geometries. Such a nanoparticle is said to be compositionally symmetrical while being dimensionally and geometrically asymmetrical.

The second endcap 110 also contacts the one-dimensional nanoparticle 102 in addition to contacting the first endcap 108. In one embodiment, the second endcap contacts the first endcap without contacting the one-dimensional nanoparticle 102. In one embodiment, the second endcap 110 envelopes the first endcap 108 either partially or completely. The second endcap 110 is generally spherical or ellipsoidal in shape and has a cross-sectional area that is circular or elliptical. While the first endcap 108 and the second endcap 110 have cross-sectional areas that are circular or elliptical, it is possible for these endcaps to have cross-sectional areas that are square, rectangular, triangular or polygonal. Cross-sectional areas that are square, rectangular, triangular or polygonal may be synthesized by using a template, where the one-dimensional nanoparticle is disposed in the template during synthesis. The first endcap 108 and the second endcap 110 can contact only one end (either 104 or 106) of the one-dimensional nanoparticle or both ends 104 and 106 of the nanoparticle. In one embodiment, the second endcap 110 is optional, i.e., the one-dimensional nanoparticle has only a first endcap 108 disposed at each end of the one-dimensional nanoparticle. However, the respective first endcaps 108 are different in composition from each other. This is discussed in further detail in the FIG. 1(B).

In one embodiment, the first endcap 108 and the second endcap 110 are concentrically mounted on the one-dimensional nanoparticle 102 i.e., they are centrally located about the axis AA' reflected by numeral 120. While the FIG. 1(A) depicts that the one-dimensional nanoparticle 102, first endcap 108 and the second endcap 110 are concentrically located about the axis 120, it is possible to have the first endcap 108 and/or the second endcap 110 mounted eccentrically mounted about the one-dimensional nanoparticle 102.

The diameter of the second endcap 110 is about 1.0 to about 3.0 times, preferably about 1.5 to about 2.7 times the diameter of the one-dimensional nanoparticle. In one embodiment, the diameter of the second endcap 110 is 2 to 30 nanometers, preferably 3 to 15 nanometers.

The first endcap and the second endcap are chemically different from each other and are selected from the group consisting of Si, Ge, Pb, SiGe, ZnO, $TiO_2$, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InN, InP, InAs, InSb, TlN, TlP, TlAs, TlSb, PbS, PbSe, PbTe, or the like, or a combination comprising at least one of the foregoing semiconductors. In an exemplary embodiment, the first endcap is CdTe or CdSe, while the second endcap is ZnSe.

Passivating molecules such as alkylphosphines, alkylphosphine oxides, amines, carboxylic acids, and the like, may be disposed on the surfaces of the nanorod heterostructures thus allowing for the solubility and coalescence to be varied. Quantum efficiency for photoluminescence can be varied by surface passivating molecules and/or by inorganic endcaps.

Figure 1B:
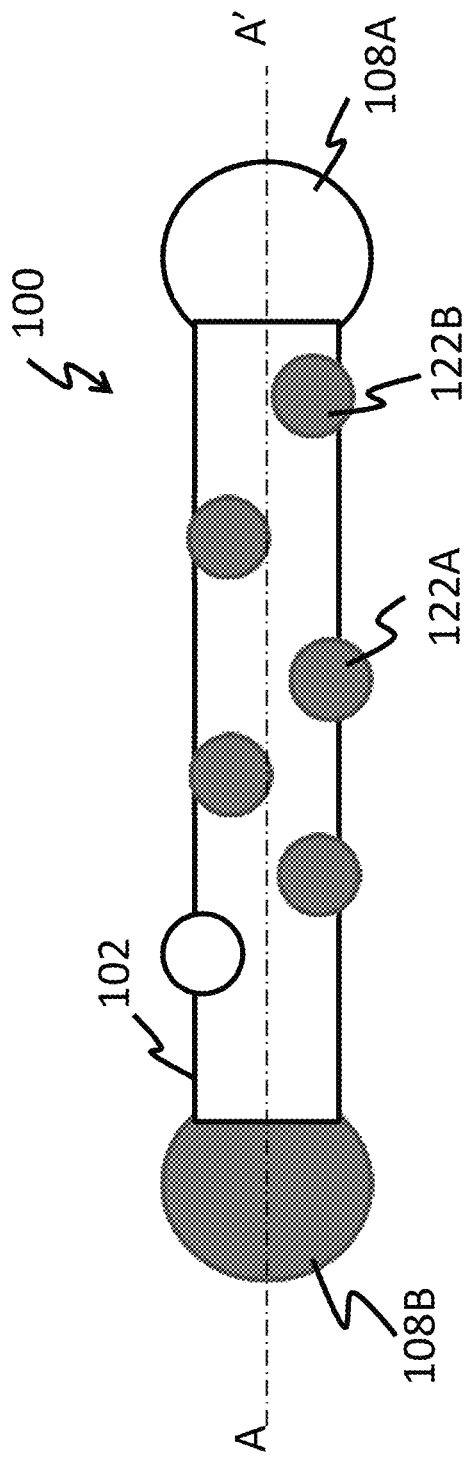
FIG. 1(B) is another depiction of the passivated nanocrystalline semiconductor nanoparticles disclosed herein.

FIG. 1(B) depicts a one-dimensional nanoparticle that has only two first endcaps 108A and 108B disposed at opposing ends of the one-dimensional nanoparticle. The two first endcaps 108A and 108B have compositions that are different from each other thus providing the one-dimensional nanoparticles with two heterojunctions. In one embodiment, the one-dimensional nanoparticles can have nodes—a first node 122A and a second node 122B disposed on their radial surfaces. The nodes 122A and 122B comprise semiconductors (such as those listed above for the first endcap and the second endcap) and are randomly distributed along the radial surface of the one-dimensional nanoparticle. During the synthesis of the one-dimensional nanoparticles, the nodes nucleate and grow randomly on the surface of the one-dimensional nanoparticles. The point of contact of the node with the radial surface of the one-dimensional nanoparticles is a heterojunction.

It is desirable for the nodes and the endcaps to have different compositions from each other in order to produce multi-heterojunction nanoparticles. The nodes 122A and 122B can have identical compositions or compositions that are different from each other depending upon the number of heterojunctions desired. When the nanoparticle has only two first endcaps 108 that have identical compositions, then the nodes 122A and/or 122B have compositions that are different from those of the endcaps 108 in order to produce a multi-heterojunction nanoparticle. If the respective endcaps 108A and 108B have different compositions from each other, then the nodes can have compositions that are similar to each other and that may be identical to one of the endcaps. In one embodiment, the nodes can have compositions that are different from the compositions of either of the endcaps. The heterojunctions produced at the point of contact of the first node 122A with the radial surface one-dimensional nanoparticle is different from the heterojunction produced at the point of the contact of the second node 122B with the same radial surface. By having different nodes having different semiconductor compositions contact the radial surface of the one-dimensional nanoparticle, the nanoparticle can have multiple heterojunctions.

The presence of a double heterojunction in the nanoparticles is advantageous in that it can be used to control and to vary the emission center of the nanoparticles. This can be used to influence emission properties and can also be used to facilitate changes in charge mobility. The heterojunction provides a selective barrier (depending upon the carrier type—electron or hole) while at the same time, permitting good passivation of the core emitting center i.e., it behaves as a good barrier for one type of carrier, while facilitating the injection of another type of carrier in addition to providing surface passivation benefits (equivalent to type I core/shells).

The composition of the materials forming the heterojunction can be used to influence the band gap and band offsets. The band gap, also called an energy gap or bandgap, is an energy range in a solid where no electron states can exist. In graphs of the electronic band structure of solids, the band gap generally refers to the energy difference (in electron volts) between the top of the valence band and the bottom of the conduction band in insulators and semiconductors.

This is equivalent to the energy required to free an outer shell electron from its orbit about the nucleus to become a mobile charge carrier, able to move freely within the solid material. The band gap is therefore an important factor determining the electrical conductivity of a solid. Substances with large band gaps are generally insulators, those with smaller band gaps are semiconductors, while conductors either have very small band gaps or none, because the valence and conduction bands overlap. Band offsets can also be used for charge carrier manipulation. The band gap and band offsets can be used to determine optical properties like the characteristic absorption/emission peak positions of corresponding materials.

By changing the composition and size (diameter or length) of the one-dimensional nanoparticle, the first endcap and/or the second endcap, the energy band gap and band offsets can be varied. Varying the energy band gap can be used to change wavelength, the efficiency and intensity of light generation in the nanoparticles. In one embodiment, the conduction band offset between the first endcap and the one dimensional nanoparticle is much higher than the conduction band offset between the first endcap and the second endcap, and where the valence band offset between the first endcap and the one-dimensional nanoparticle is much lower than one between the first endcap and the second endcap. In another embodiment, the conduction band offset between the first endcap and one-dimensional nanoparticle is much lower than one between the first endcap and the second endcap, and where the valence band offset between the first endcap and one-dimensional nanoparticle is much lower than one between the first endcap and the second endcap. In yet another embodiment, one of two heterojunctions that are formed by the first endcap has a smaller conduction band offset and a larger valence band offset than others, and the other has larger conduction band offset and smaller valence band offset.

Figure 2:
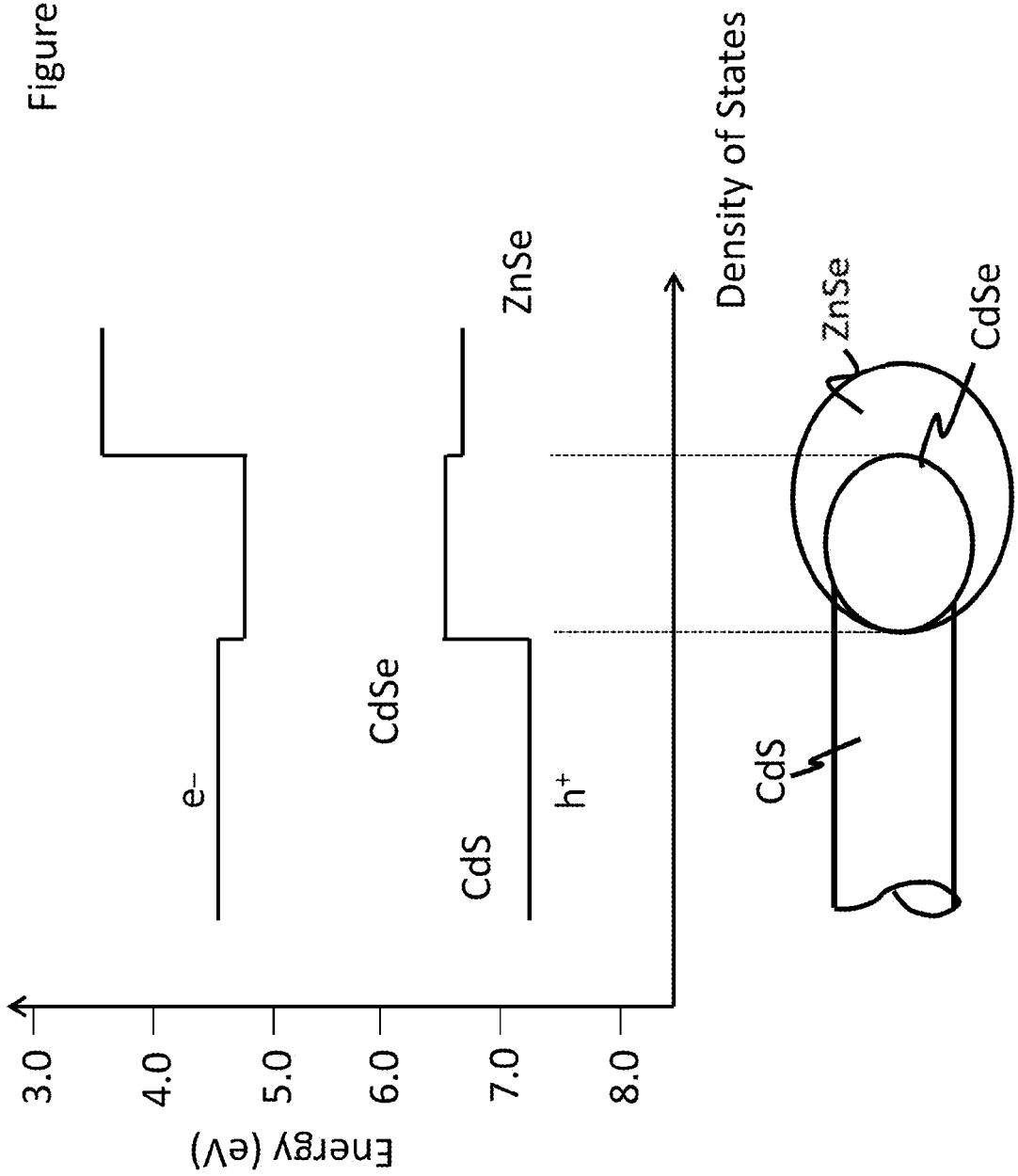
FIG. 2 shows how the band gap can be varied (i.e., spatially modulated) by changing the composition of the nanoparticles.
Figure 3:
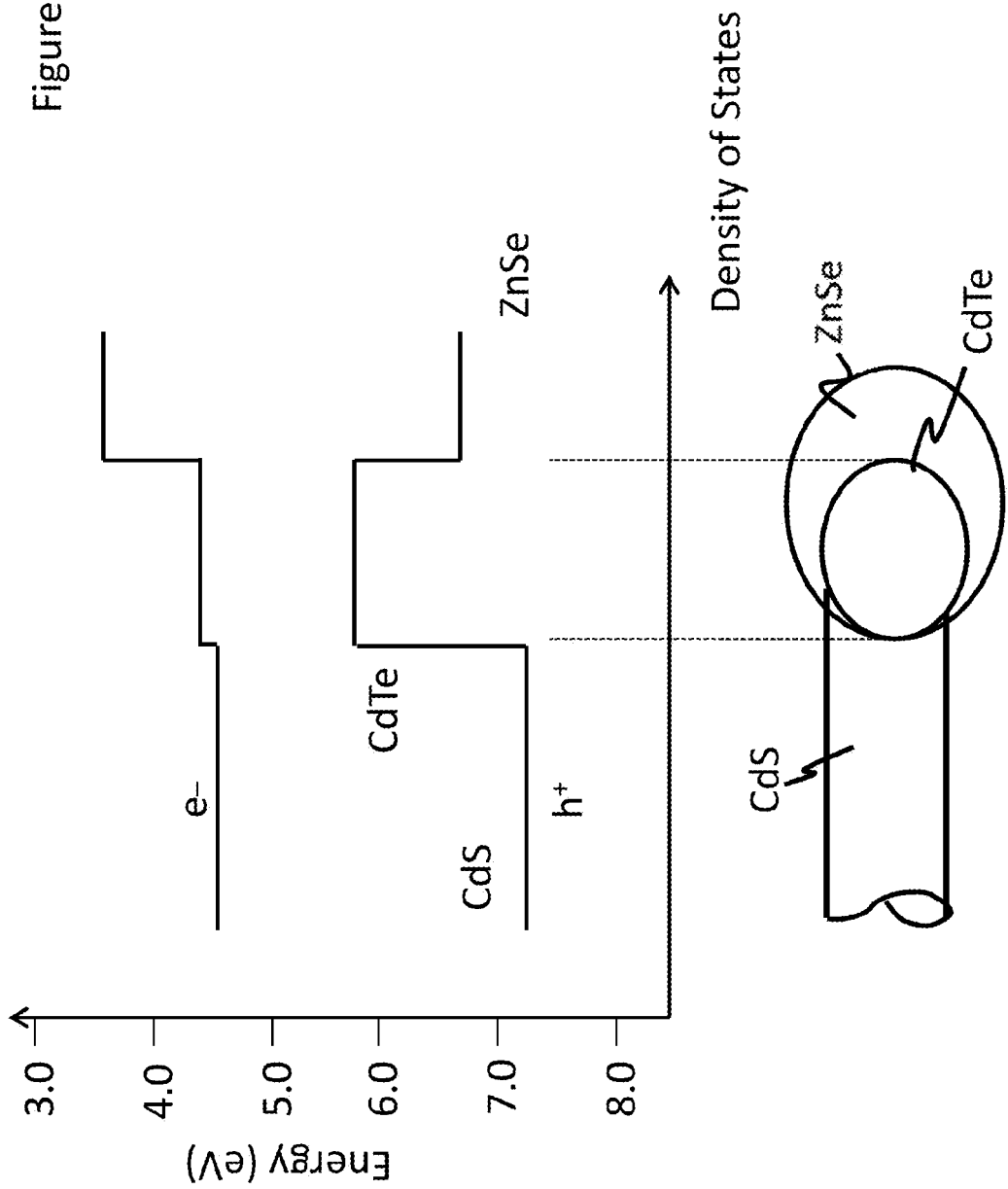
FIG. 3 also shows how the band gap can be varied (i.e., spatially modulated) by changing the composition of the nanoparticles. In the FIG. 3, the one-dimensional nanoparticle comprises cadmium sulfide, while the first endcap comprises cadmium telluride and the second endcap comprises zinc selenide.

FIGS. 2 and 3 show how the band gap can be varied (spatially modulated) by changing the composition of the nanoparticles. In the FIG. 2, the nanoparticle comprises a cadmium sulfide (CdS) one-dimensional nanoparticle, with the first endcap being cadmium selenide (CdSe) and the second endcap being zinc selenide (ZnSe). In the FIG. 2, the interface between the cadmium sulfide one-dimensional nanoparticle and the cadmium selenide first endcap is the first heterojunction, while the interface between the zinc selenide second endcap and the cadmium selenide first endcap is the second heterojunction.

From the FIG. 2, it can be seen that the band gap between the conduction band and the valence band of the cadmium sulfide is greater than 2.4 electron volts, while the band gap between the conduction band and the valence band of the cadmium selenide is greater than 1.7 electron volts and the band gap between the conduction band and the valence band of the zinc selenide is greater than 2.7 electron volts.

By endcapping the cadmium sulfide one-dimensional nanoparticle with the cadmium selenide endcap, charge carriers will be confined to cadmium selenide regions and the effective band gap (i.e., the exciton energy level) can be reduced from 2.4 electron volts (eV) to 1.7 eV while passivating the nanoparticle. This energy band gap difference (i.e., the exciton energy level) can influence the light emission characteristics of the nanoparticles and also the light emission characteristics of any device that uses the nanoparticles. The bandgap energy stated here is merely an example based on the bulk properties of individual materials, and nanoparticles can have different band gaps than the bulk material because of quantum confinement effects.

By changing the composition of the first and the second endcaps, the band gap between the conduction and valence bands can be changed. For example, in the FIG. 3, it can be seen that the band gap between the conduction and valence band can be reduced by using a first endcap that comprises cadmium telluride. In the FIG. 3, it may be seen that the one-dimensional nanoparticle comprises cadmium sulfide, while the first endcap comprises cadmium telluride and the second endcap comprises zinc selenide. By endcapping the cadmium sulfide one-dimensional nanoparticles with the cadmium telluride first endcap, charge carriers can be potentially confined in the cadmium telluride region under an applied bias and the bandwidth is reduced to 1.75 eV, while the capped component is passivated.

The reactions to produce the nanoparticles are now detailed below. The following abbreviations are used to detail the reactants. By "TOPO, TOP, TBP, HDA, HPA, ODPA, OA, ODE, TDPA, and TOA" it is meant trioctylphosphine oxide, trioctylphosphine, tri-n-butylphosphine, hexadecylamine, hexylphosphonic acid, octadecylphosphonic acid, octylamine, octadecene, tetradecylphosphonic acid and trioctylamine respectfully.

The nanoparticles may be manufactured by a variety of different methods. In one embodiment, in one method of manufacturing the nanoparticles, a first precursor to the semiconductor (e.g., cadmium oxide) is reacted in a first solvent (e.g., trioctylphosphine oxide) with a first surfactant (e.g., N-octyldecyl phosphonic acid) to form a first complex (e.g., Cd-ODPA—cadmium-N-octyldecyl phosphonic acid). The first surfactant prevents the particles from contacting each other. The first complex is formed at a temperature of 150 to 400° C., specifically 200 to 350° C. preferably in an inert atmosphere. The inert atmosphere comprises nitrogen, argon, carbon dioxide, or the like. In an exemplary embodiment, the inert atmosphere comprises nitrogen or argon and substantially excludes oxygen and water. The reaction may be conducted in a batch reactor or in a continuous reactor. In an exemplary embodiment, the first reaction is conducted in a batch reactor.

To a mixture comprising the first complex is added a second precursor (e.g., sulfur (S) dissolved in TOP) to produce the one-dimensional nanoparticles. The length and diameter of the one-dimensional nanoparticles can be varied by controlling the amount of the first and second precursor and that of the first surfactant. The reaction temperature and time can also be varied to change the dimensions of the one-dimensional nanoparticles. The reaction temperature during the growth of the one-dimensional nanoparticles is generally reduced during the growth of the one-dimensional nanoparticles. In one embodiment, the reaction temperature is reduced from 400° C. to less than or equal to 350° C., preferably to less than or equal to 330° C. during the growth of the one-dimensional nanoparticles. The growth of the one-dimensional nanoparticles is terminated by reducing the temperature to less than or equal to 300° C., preferably to less than or equal to 275° C., and to preferably less than or equal to 250° C. The one-dimensional nanoparticles are then purified and stored for the passivating process where the first endcap and the second endcap are reacted onto them. The purification is optional and can be conducted by precipitation centrifugation, decanting, filtering, or the like.

The first endcap is then synthesized by adding a third precursor (which is a precursor to the first endcap—e.g., a selenium precursor) to a reaction mixture that comprises a solvent and the one-dimensional nanoparticles. The formation of the first endcap terminates the lengthwise growth of the one-dimensional nanoparticle. The third precursor is added to a mixture of the one-dimensional nanoparticles along with additional solvent (e.g., trioctylphosphine) in a reactor. The reaction temperature is increased to greater than or equal to 100° C., specifically greater than or equal to 225° C., and more specifically greater than or equal to 250° C. The reaction between the one-dimensional nanoparticles and the third precursor produces the first endcap on the one-dimensional nanoparticles. The one-dimensional nanoparticles along with the first endcap can then be separated from the remainder of the reaction mixture and purified by the methods mentioned above. In an exemplary embodiment, the one-dimensional nanoparticles with the first endcap are purified by dissolving them in a solvent followed by centrifugation.

The second endcap is then reacted onto the first endcap. This is accomplished by growing the second endcap onto the one-dimensional nanoparticles that are passivated by the first endcap. The first endcap passivates the ends of the one-dimensional nanoparticle. A fourth precursor (which is a precursor to the second endcap—e.g., zinc acetate) is taken in a reactor along with a solvent and a ligand or with a plurality of solvents and ligands. The solvents may be degassed following which they are heated to a temperature of greater than or equal to 150° C. During the heating, an intermediate (e.g., zinc oleate) may optionally be formed. The reaction solution is then cooled to less than or equal to 100° C., preferably less than or equal to 50° C. The one-dimensional nanoparticles along with the first endcap reacted thereto may be added to the reaction vessel along with a fifth precursor (e.g., a selenium precursor) to form the second endcap. The fifth precursor is slowly injected into the reaction vessel. The temperature of the reaction vessel is increased to greater than or equal to 200° C., preferably greater than or equal to about 250° C. during the injection of the fifth precursor. The thickness of the second endcap is determined by the amount of the fourth and fifth precursor added to the reaction vessel. The resulting nanoparticles (which now comprise a one-dimensional nanoparticle endcapped by the first endcap and the second endcap) are separated and purified as desired. The methods of separation and purification are detailed above.

In the aforementioned method, the first precursor and the fourth precursor comprises barium, indium, zinc, cadmium, magnesium, mercury, aluminum, gallium, thallium, or lead. The second precursor, the third precursor and the fifth precursor comprises selenium, tellurium, sulfur, arsenic, bismuth, phosphorus, or tin.

In the method detailed above, the first precursor is added to the reaction mixture in an amount of 10 to 30 weight percent, based on the total weight of the first complex. The first surfactant is added to the reaction mixture in an amount of 70 to 90 weight percent, based on the total weight of the first complex. The second precursor is added to the reaction mixture in an amount of 20 to 50 weight percent, based on the total weight of the one dimensional nanoparticles. The molar ratio of the first precursor to the second precursor is 4:1 to 1:1.

The third precursor is added to the reaction mixture in an amount of 20 to 50 weight percent, based on the total weight of the passivated nanoparticles. The fourth precursor is added to the reaction mixture in an amount of 5 to 20 weight percent, based on the total weight of the passivated nanoparticles. The fifth precursor is added to the reaction mixture in an amount of 5 to 20 weight percent, based on the total weight of the passivated nanoparticles. The molar ratio of the fourth precursor to the fifth precursor is from 4:1 to 1:1. The heterojunctions are localized, i.e., they are present at the ends of the one-dimensional nanoparticle, between the first endcap and the second endcap, or at nodes on the one-dimensional nanoparticle.

The nanoparticles having a plurality of heterojunctions may be used in a variety of different applications. These nanoparticles may be used in lasers, transistors, bipolar transistors, solar cells, and the like. They can be easily processed in solution.

In one embodiment, the nanoparticles comprise two types of heterojunctions where the type II staggered band offset allows for the efficient injection of electrons and holes, while the type I offset defines a recombination center for highly efficient light emission. In addition, the anisotropic rod shape of these nanoparticles improves nanocrystal performance. The anisotropic shape permits alignment of the semiconductor components of the proper charge layers within a device.

Figure 4:
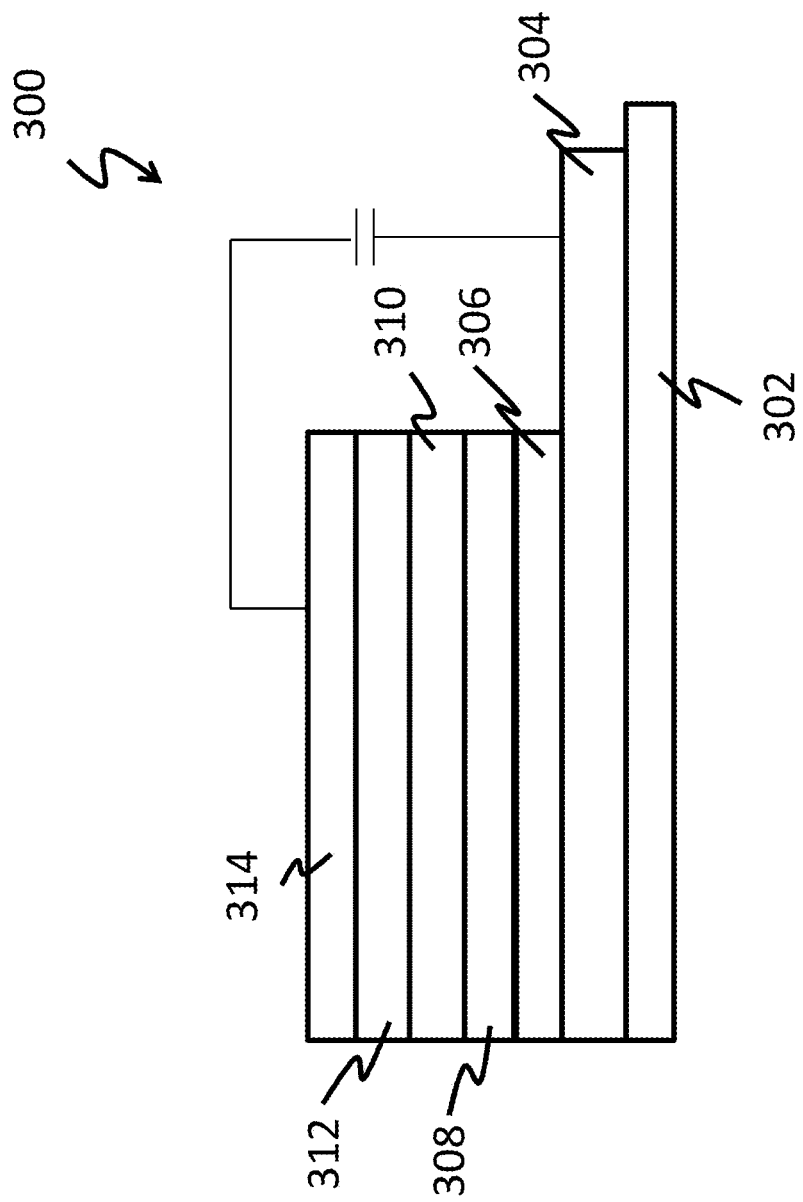
FIG. 4 is a schematic depiction of an exemplary electroluminescence (EL) device.

The nanoparticles can be used in EL devices. An exemplary EL device is shown in the FIG. 4. The FIG. 4 depicts an EL device 300 comprising the nanoparticles with the double heterojunction. The device 300 comprises a substrate 302, a first electrode 304, a hole injection layer 306, a hole transport layer 308, a nanoparticle layer 310 (which contains the passivated nanoparticles disclosed herein), an electron transport layer 312 and a second electrode 314. The substrate 302 generally comprises an optically transparent, electrically insulating glass or an optically transparent, electrically insulating polymer. The first electrode 304 can comprise an optically transparent conductive polymer or metal oxide. Examples of the first electrode 304 are indium tin oxide, tin oxide, thin films of polypyrrole, polyaniline, polythiophene, or the like. A suitable hole injection material for use in the hole injection layer 306 is PEDOT:PSS (poly(3,4-ethylenedioxythiophene)/poly(styrenesulfonate), which is a polymer mixture of two ionomers.

The hole transport layer 308 comprises poly(9,9-dioctyl-fluorene-co-N-(4-butyl-phenyl)-diphenylamine) (TFB), poly (N,N'-bis(4-butylphenyl)-N,N'-bis(phenyl)benzidine) (poly-TPD), poly-N-vinyl carbazole (PVK), tetrafluoroethylene-perfluoro-3,6-dioxa-4-methyl-7-octenesulphonic acid copolymer (PFI), or nickel oxide (NiO). The nanoparticle layer 310 comprises the nanoparticles detailed above, while the electron transport layer 312 comprises zinc oxide or titanium oxide nanoparticles. The second electrode 314 (which serves as the cathode) comprises a metal film, an example of which is an aluminum film. Other materials may be used in the first electrode 304, the hole injection layer 306, the hole transport layer 308, the electron transport layer 312 and the second electrode 314.

The passivated nanoparticles disclosed herein are advantageous in that they produce a photoluminescence intensity that compares favorably with comparative compositions that have the same ingredients but that are not in the form of passivated nanorods, when both compositions are illuminated with an identical intensity of light. The passivated nanoparticles produce light in the wavelength region of 550 to 700 nanometers, with a peak intensity at about 630 nanometers. By changing the size of the endcaps, the color of light emitted by the nanorods can also be changed.

In one embodiment, the passivated nanoparticles can self-assemble to be parallel to each other, when disposed upon a surface. The high aspect ratio of the one-dimensional nanoparticles permits this form of self-assembly. The self-assembly permits increased photoluminescence efficiency and can also be used to produce a variety of colors when illuminated by light.

The compositions and the methods disclosed herein are exemplified by the following non-limiting examples.

EXAMPLE

Example 1

This example demonstrates the manufacturing the passivated nanoparticles. The reactions were carried out in a standard Schlenk line under $N_2$ atmosphere. Technical grade trioctylphosphine oxide (TOPO) (90%), technical grade trioctylphosphine (TOP) (90%), technical grade octylamine (OA) (90%), technical grade octadecene (ODE) (90%), CdO (99.5%), Zn acetate (99.99%), S powder (99.998%), and Se powder (99.99%) were obtained from Sigma Aldrich. N-octadecyl phosphonic acid (ODPA) was obtained from PCI Synthesis. ACS grade chloroform, and methanol were obtained from Fischer Scientific. Materials were used as received.

Preparation of the One-Dimensional Nanoparticles—CdS Nanorods

First, 2.0 grams (g) (5.2 millimoles (mmol)) of TOPO, 0.67 g (2.0 mmol) of ODPA and 0.13 g (2.0 mmol) of CdO were prepared in a 50 ml three-neck round-bottom flask. The mixture was degassed at 150° C. for 30 minutes (min) under vacuum, and then heated to 350° C. under stirring. As Cd-ODPA complex was formed at 350° C., the brown solution in the flask became optically transparent and colorless after about 1 hour. Then, the solution was degassed at 150° C. for 10 minutes to remove by-products of complexation including $O_2$ and $H_2O$. After degassing, the solution was heated to 350° C. under a $N_2$ atmosphere. Sulfur (S) precursor containing 16 milligrams (mg) (0.5 mmol) of S dissolved in 1.5 milliliters (ml) of TOP was swiftly injected into the flask with a syringe. Consequently, the reaction mixture was quenched to 330° C. where the CdS growth was carried out. After 15 minutes, the CdS nanorods growth was terminated by cooling to 250° C. where the CdSe growth on CdS nanorods was carried out. An aliquot of the CdS nanorods was taken, and cleaned by precipitation with methanol and butanol for analysis. The CdS/CdSe heterostructures were formed by adding Se precursor to the same reaction flask, maintained under $N_2$ atmosphere as described below.

Passivation of the Nanorods by the First Endcap—CdS/CdSe Nanorod Heterostructures Following the formation of CdS nanorods, Se precursors containing 20 mg (0.25 mmol) of Se dissolved in 1.0 ml of TOP was slowly injected at 250° C. at a rate of 4 milliliters per hour (ml/h) via syringe pump (total injection time ~15 minutes). Then, the reaction mixture was aged for an additional 5 minutes at 250° C. before the reaction flask was rapidly cooled by air jet. An aliquot of CdS/CdSe nanorod heterostructures was taken and cleaned by precipitation with methanol and butanol for analysis. The final solution was dissolved in chloroform and centrifuged at 2000 revolutions per minute (rpm). The precipitate was redissolved in chloroform and stored as a solution. The CdS band-edge absorption peak corresponds 0.75 when the solution is diluted by a factor of 10.

Formation of the Second Endcap—CdS/CdSe/ZnSe Double Heterojunction Nanorods

CdS/CdSe/ZnSe double heterojunction nanorods were synthesized by growing ZnSe onto CdS/CdSe nanorod heterostructures. For Zn precursor, 6 ml of ODE, 2 ml of OA and 0.18 g (1.0 mmol) of Zn acetate were degassed at 100° C. for 30 minutes. The mixture was heated to 250° C. under $N_2$ atmosphere and consequently Zn oleate was formed after 1 hour. 2 ml of previously prepared CdS/CdSe solution was injected into Zn oleate solution after cooling to 50° C. Chloroform in the mixture was allowed to evaporate for 30 min under vacuum. ZnSe growth was initiated by a slow injection of Se precursor containing 20 mg (0.25 mmol) of Se dissolved in 1.0 ml of TOP at 250° C. Thickness of ZnSe on CdS/CdSe nanorod heterostructures was controlled by the amount of Se injected. The ZnSe growth was terminated by removing heating mantle after injecting desired amount of Se precursor. Cleaning procedures were same as described for the CdS nanorods.

Alternative Method for Forming the Second Endcap—CdS/CdSe/ZnSe Double Heterojunction Nanorods Coordinating solvents such as TOA can alternatively be used for growing ZnSe. 5 ml of TOA, 1.2 ml of OA and 0.18 g (1.0 mmol) of Zn acetate were degassed at 100° C. for 30 minutes. The mixture was heated to 250° C. under $N_2$ atmosphere and consequently Zn oleate was formed after 1 hour. 2 ml of previously prepared CdS/CdSe solution was injected into Zn oleate solution after cooling to 50° C. Chloroform in the mixture was allowed to evaporate for 30 min under vacuum. ZnSe growth was initiated by a slow injection of Se precursor containing 20 mg (0.25 mmol) of Se dissolved in 1.0 ml of TOP at 250° C. Thickness of ZnSe on CdS/CdSe nanorod heterostructures was controlled by the amount of Se injected. The ZnSe growth was terminated by removing heating mantle after injecting desired amount of Se precursor. Cleaning procedures were same as described for the CdS nanorods.

Example 2

This example was conducted to demonstrate the use of the nanoparticles in an electroluminescent device. The device shown in the FIG. 4 was used. The device 300 comprises a glass substrate 302, a first electrode 304 that comprises indium tin oxide, a hole injection layer 306 comprising PEDOT:PSS, a hole transport layer 308 comprising TFB, a nanoparticle layer 310 whose contents are detailed below, an electron transport layer 312 comprising zinc oxide nanoparticles, and the second electrode 314 comprising aluminum.

The nanoparticle layer 310 contains either the nanoparticles disclosed herein (CdS nanorods, passivated by a first endcap that comprises CdSe and a second endcap that comprises ZnSe) or a comparative material that comprises core-shell quantum dots, where the core is CdSe and the shell is ZnSe.

Figure 5:
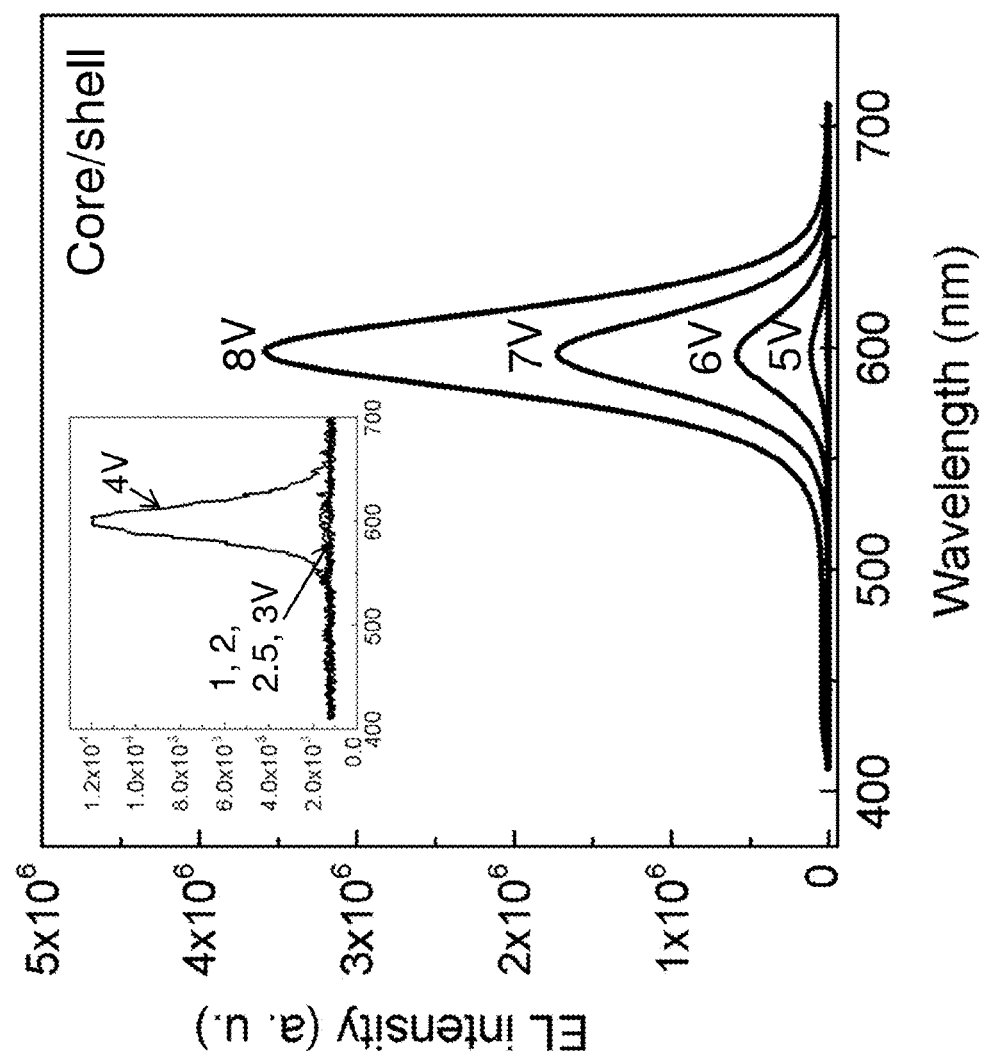
FIG. 5(A) is a graph that shows the EL spectra for the core-shell (CdSe/ZnS) quantum dots.
FIG. 5(B) is a graph that shows the EL spectra for the nanoparticles disclosed herein (CdS nanorods, passivated by a first endcap that comprises CdSe and a second endcap that comprises ZnSe)
Figure 5:
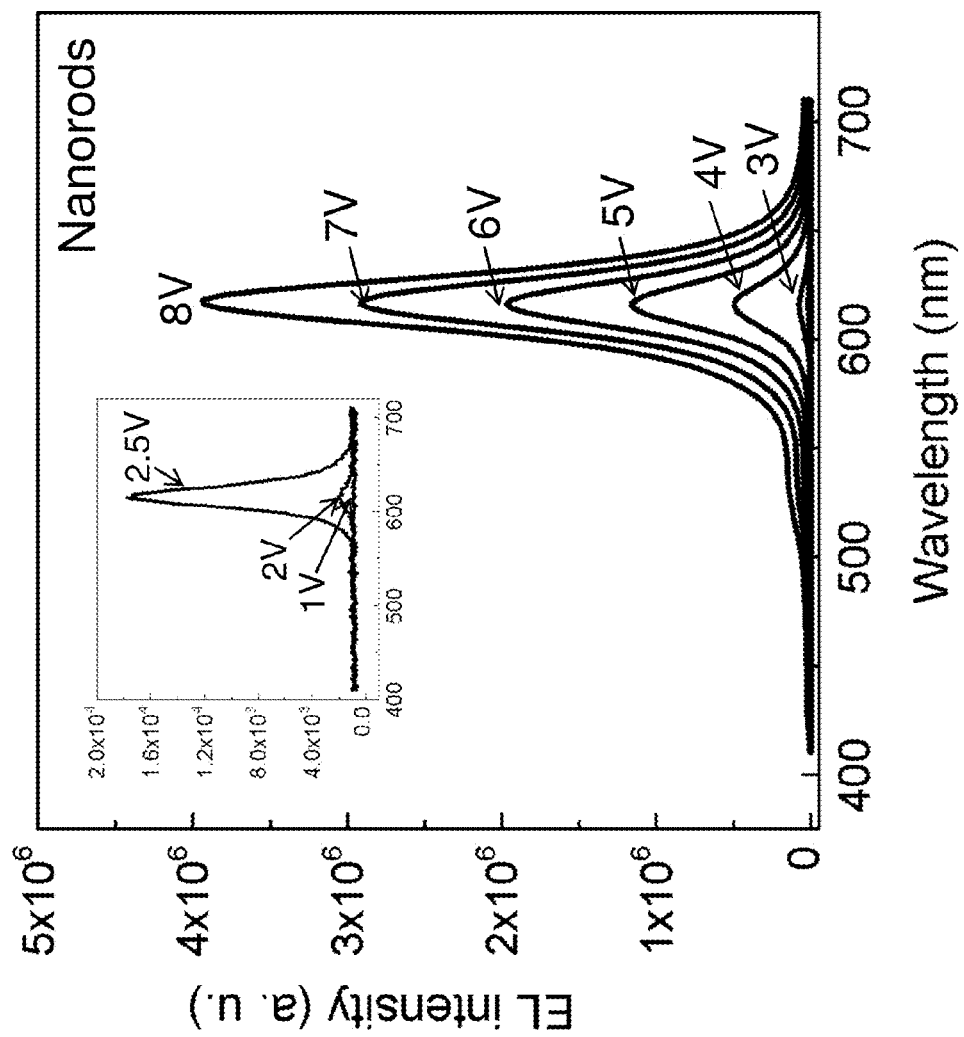

The EL performance of the EL device with the respective materials is shown in the FIG. 5. The FIG. 5(A) show the EL spectra for the core-shell (CdSe/ZnS) quantum dots, while the FIG. 5(B) shows the EL spectra for the nanoparticles disclosed herein (CdS nanorods, passivated by a first endcap that comprises CdSe and a second endcap that comprises ZnSe).

From the FIGS. 5(A) and 5(B), it may be seen that the EL spectra for the passivated nanorods is shifted to higher wavelengths. The core shell quantum dots have a peak intensity at 600 nanometers, while the passivated nanorods have a peak emission at 630 nanometers. Devices with the passivated nanorods have a considerably lower turn-on voltage for the EL intensity of ca. 2.5V compared to ca. 4V for the devices with the core shell quantum dots.

Figure 6:
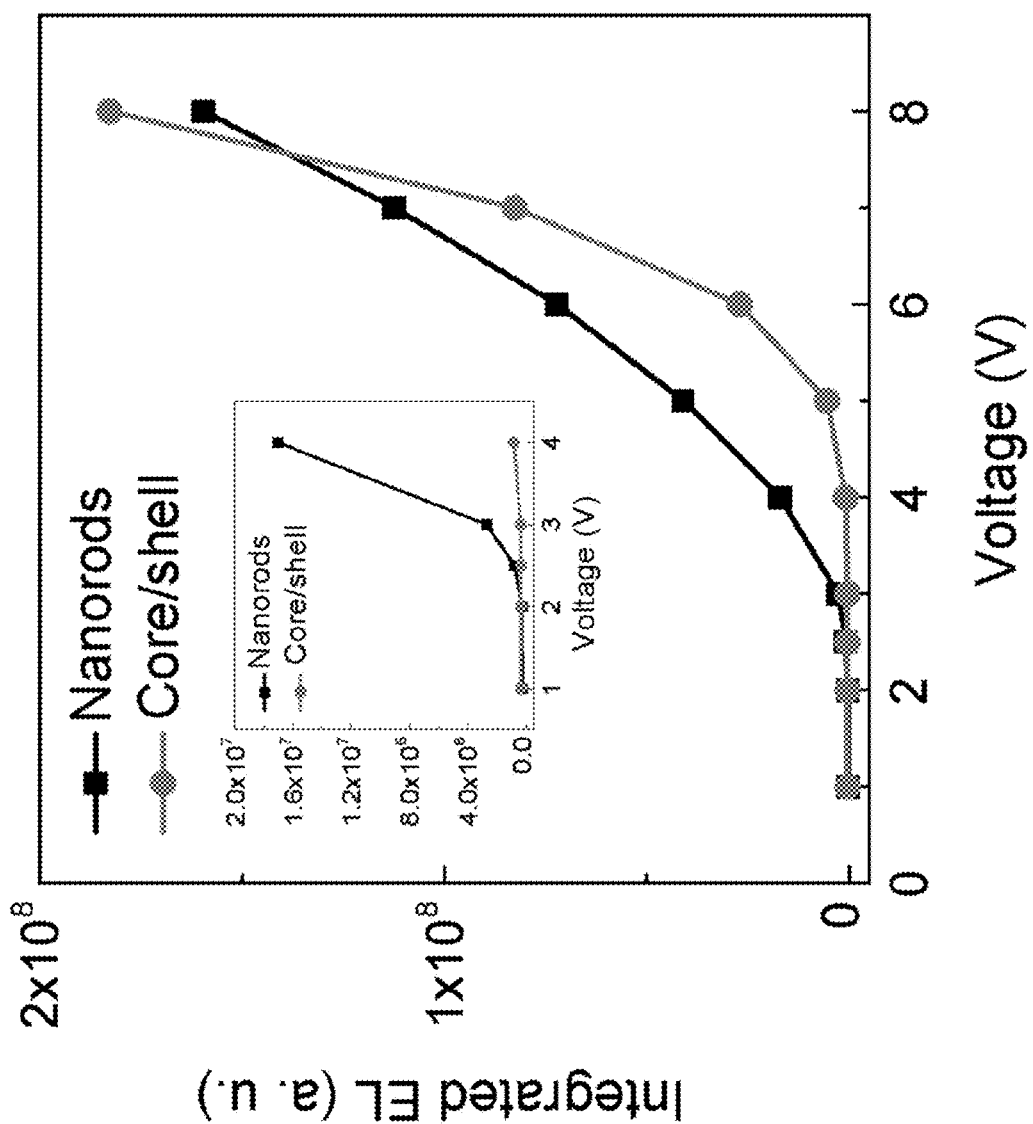
FIG. 6 is a graph that shows the integrated EL versus voltage for the quantum dots and for the nanoparticles disclosed herein.

The FIG. 6 is a graph that shows the integrated EL versus the applied voltage for the core-shell CdSe/ZnS quantum dots and the nanoparticles (CdS nanorods, passivated by a first endcap that comprises CdSe and a second endcap that comprises ZnSe). From the FIG. 6, it may be seen that the integrated EL is greater for the CdS nanorods, passivated by a first endcap that comprises CdSe and a second endcap that comprises ZnSe than for the quantum dots in low voltage regions.

What is claimed is:

1. A semiconducting nanoparticle comprising:
   a one-dimensional nanoparticle having a first end and a second end, where the second end is opposed to the first end;
   a first endcap at each of the first end and the second end, wherein the first endcaps comprise a first semiconductor; and
   a second endcap at each of the first end and the second end, wherein the second endcaps comprise a second semiconductor and partially or completely encircle the first endcaps at each of the first end and the second end;
   wherein each of the first endcaps contacts a surface of the one-dimensional nanoparticle at each of the first end and the second end producing a first heterojunction at each of the points of contact;
   wherein the second endcap at the first end contacts a surface of the first endcap at the first end, producing a second heterojunction at the point of contact, and the second endcap at the second end contacts a surface of the first endcap at the second end producing a second heterojunction at the point of contact;
   wherein the first heterojunction is compositionally different from the second heterojunction.

2. An article comprising:
   a first electrode;
   a second electrode; and
   a layer comprising a semiconducting nanoparticle of claim 1 disposed between the first electrode and the second electrode.

3. The article of claim 2, wherein the article emits visible light when subjected to an electric potential and current.

* * * * *